United States Patent
Muentefering et al.

(10) Patent No.: US 8,125,273 B2
(45) Date of Patent: Feb. 28, 2012

(54) APPARATUS AND METHOD FOR DRIVING AN LED

(75) Inventors: Dirk Muentefering, Wedemark (DE); Frank Gelhausen, Isernhagen (DE); Oliver Piepenstock, Hannover (DE); Andreas Bock, Isernhagen (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 12/763,575

(22) Filed: Apr. 20, 2010

(65) Prior Publication Data

US 2010/0295617 A1 Nov. 25, 2010

(30) Foreign Application Priority Data

Apr. 23, 2009 (DE) .......................... 10 2009 018 701

(51) Int. Cl.
*H03F 3/45* (2006.01)
(52) U.S. Cl. ..................................... 330/253; 372/38.02
(58) Field of Classification Search .......... 330/252–261; 372/38.02, 38.07, 38.1
See application file for complete search history.

(56) References Cited

U.S. PATENT DOCUMENTS

| | | | |
|---|---|---|---|
| 5,883,910 A * | 3/1999 | Link | 372/38.07 |
| 6,097,159 A | 8/2000 | Mogi et al. | |
| 6,130,562 A | 10/2000 | Bosch et al. | |
| 6,850,104 B2 * | 2/2005 | Fattaruso | 327/202 |
| 6,879,608 B1 | 4/2005 | Schuelke et al. | |
| 7,145,928 B1 | 12/2006 | Maxim et al. | |
| 2003/0086455 A1 | 5/2003 | Ciubotaru et al. | |

OTHER PUBLICATIONS

DE Search Report dated May 20, 2010.

* cited by examiner

*Primary Examiner* — Hieu Nguyen
(74) *Attorney, Agent, or Firm* — John J. Patti; Wade J. Brady, III; Frederick J. Telecky, Jr.

(57) ABSTRACT

Here, a driver for an light emitting diode (LED) is provided. Within this driver, several differential pairs of bipolar transistors are employed in an input stage and output stage along with a control loop. Collectively, these components operate together to drive the LED with a low headroom voltage while still achieving high driver performance in terms of edge speed and jitter.

16 Claims, 2 Drawing Sheets

APPARATUS AND METHOD FOR DRIVING AN LED

CROSS-REFERENCE TO RELATED APPLICATIONS

This application claims priority from German Patent Application No. 10 2009 018 701.4, filed Apr. 23, 2009, which is hereby incorporated by reference for all purposes.

FIELD OF THE INVENTION

The present invention generally relates to an light emitting diode (LED) driver and, more particularly, to current control circuitry for a low headroom DC coupled laser diode.

BACKGROUND

There is a general need for an integrated circuit (IC) for driving laser-diodes or LEDs in high data rate transmission systems. For these and other applications using LEDs, current driver circuits are needed which may operate at a low headroom voltage while still achieving high drive performance in terms of edge speed and jitter.

VCSEL (Vertical Cavity Surface Emitting Laser) diodes are often used as LEDs. The circular beam of a VCSEL can easily be coupled with a fiber. This is mainly due to the characteristic of VCSEL diodes as surface emission rather than edge emission devices and they are known for their excellent power efficiency and durability. Accordingly, VCSEL diodes are widely used in low cost optical transmission systems. However, in high data rate transmission systems, the VCSEL diodes are turned on and off with very high switching frequencies. This requires fast, power efficient and precise driving stages.

Furthermore, the forward voltage of laser-diodes is a function of the wavelength of the emitted light. It is well known in the art that gallium aresenide or GaAs is used as substrate for 850 nm laser-diodes. The corresponding bandgap energy is approximately 1.5 eV. Other diodes such as, for example, 1310 nm or 1550 nm laser-diodes, use indium phosphide or InP as a substrate.

In these devices the bandgap energy is approximately 1 eV and 0.8 eV, respectively. The forward voltage of a Laser-diode at a temperature of zero Kelvin is equal to the bandgap energy divided by the elementary charge e. Therefore the value of the forward voltage is approximately 1.5V at 850 nm, approximately 1.0V at 1310 nm, and approximately 0.8V at 1550 nm. At higher temperatures the forward voltage also becomes a function of the doping profile of a diode. Depending on the magnitude of the current flowing through the laser-diode and its internal resistance, the voltage drop can reach values of up to 2.1V, e.g., for VCSEL type laser-diodes emitting light at 850 nm wavelength. Since in many systems a minimum supply voltage of 2.9V is used, the remaining headroom for the laser-diode current driving stage can be as low as 0.8V or even less.

SUMMARY

In one aspect of the invention an apparatus for driving a LED is provided. The apparatus may comprise an input stage for receiving a driver input signal and an output stage. The output stage is coupled to the input stage. The output stage can comprise a first differential pair that is configured to be coupled with a first side to the LED. The first differential pair may further be configured to control an output current through the LED in response to the driver input signal. The output stage may be adapted to provide a reference signal. The reference signal may be configured to be used in a control loop for controlling a voltage level of the input stage. The reference signal may advantageously be used to control a common mode voltage level of the input stage so as to control the output current. A variation of the (e.g., common mode) voltage level of the input stage (i.e., a voltage level being related to the output voltage of the input stage) may advantageously result in a respective variation of the common mode voltage level at the input of the output stage, which may then define a characteristic (e.g., a magnitude or average value) of the output current. This aspect of the invention provides that a control loop is implemented that serves to control a characteristic (e.g., a magnitude, a ratio and/or an average value) of the current fed to the LED. Therefore, the first differential pair in the output stage does not need a current source for determining the output current. The differential pair in the output stage may then be coupled to ground or negative supply voltage level through a component providing less voltage drop than a current source. This can increase the voltage headroom for the LED, increase edge speed and reduce jitter.

The input stage may comprise a differential pair, which may receive the driver input signal. The differential pair may advantageously be supplied with the common mode voltage level which is controlled in response to the reference signal. This aspect of the invention provides an efficient way of implementing a control loop for controlling a characteristic of the output current.

The input stage and the output stage may be coupled through a level shifter. The level shifter may shift and transform the output signal from the input stage and provide a level shifted and transformed output signal for the output stage. A common mode level of the output signal of the input stage may then be controlled in response to the reference signal from the output stage. This variation of the common mode voltage level may advantageously be preserved when the signal propagates through the level shifter.

Furthermore, the output stage may comprise a second differential pair coupled to operate in accordance with the first differential pair and to provide the reference signal. The second differential pair may be coupled to receive the same input signals as the first differential pair. In a bipolar semiconductor technology, the first and second differential pairs can comprise pairs of bipolar transistors. The emitters of the transistors of the first and second differential pair may then all be coupled together. The emitters of the transistors of the first and second differential pairs may then be coupled to ground (ground is also referred to as a negative supply voltage level and vice versa). The collector of one transistor of the first differential pair may be coupled to the LED. The collectors of the transistors of the second differential pair may be coupled together. The combined collector currents of the second differential pair may then be used as the reference signal.

The reference signal may indicate a magnitude of the output current. The reference signal may be combined with a configuration signal for providing a general setting for the common mode voltage level of the input stage. The configuration signal may then serve as a reference signal for the control loop for controlling the common mode voltage level.

The apparatus may further comprise a voltage follower. The voltage follower may be coupled with an input to the LED. This means that the voltage follower may be coupled to the node to which the LED is coupled. This can be the collector of one transistor of the first differential pair. The voltage follower may be coupled to a second side (i.e., for example the collector of the second transistor of the first differential pair) of the first differential pair. The voltage follower may then establish the same voltage level on the second side of the first differential pair as on the first side (i.e. the collectors of both transistors are biased to the same collector voltages). This is a second control loop that serves to avoid the current source in the driving stage and improves precision of the driver.

The differential pair of the input stage may advantageously comprise transistor loads. In a bipolar semiconductor technology, a bipolar transistor may be coupled to the collectors of the transistors of the differential pair of the input stage. Using transistors instead of resistors provides a pre-distortion of the output signals of the input stage, which are fed to the output stage. Furthermore, degeneration resistors may be coupled to the emitters of the transistors of the differential pair of the input stage. This provides that the output current becomes a linear function of the input voltage applied to the input stage.

The first differential pair of the output stage may be directly coupled to ground (or negative supply voltage level). However, in another embodiment, the first differential pair may be coupled through an inductor to ground or negative supply voltage level. An inductor may be coupled between the emitters of the first differential pair and ground/negative supply voltage level. An inductor provides high impedance for high frequencies, which leads to a constant current, despite high frequency noise at the output stage. This can serve to decrease jitter.

In an aspect of the invention, the second differential pair of the output stage may be dimensioned such that a current through the second differential pair is much smaller than the current through the first differential pair. In a bipolar technology the emitter areas of the transistors of the second differential pair may be n times smaller than the emitter areas of the transistors of the first differential pair, with n being a positive integer value.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION

Figure 1:
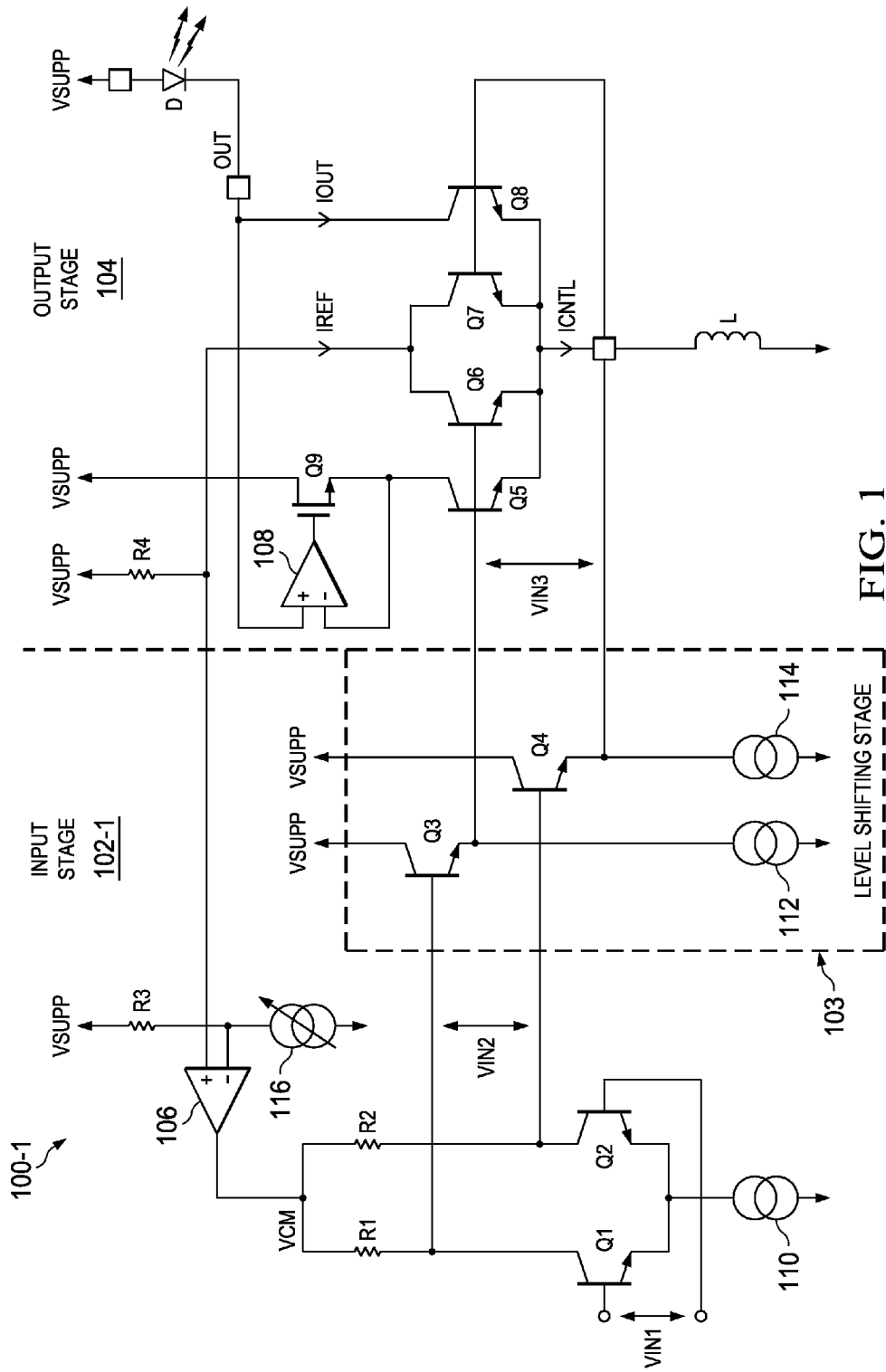
FIGS. 1 and 2 show a simplified circuit diagrams of examples of an IC in accordance with a preferred embodiment of the present invention

Refer now to the drawings wherein depicted elements are, for the sake of clarity, not necessarily shown to scale and wherein like or similar elements are designated by the same reference numeral through the several views.

Referring to FIG. 1 of the drawings, the reference numeral 100-1 generally designates an IC in accordance with a preferred embodiment of the present invention. Coupled to IC 100-1 is an LED or laser-diode D (which is generally drives by the IC 100-1) and an inductor L (which operates to provide feedback to the IC 100-1. Other elements and/or devices (which are not show) may also be coupled to IC 100-1. IC 100-1 also generally comprises an input stage 102-1, a level shifting stage 103, and an output stage 104. An input stage 102-1 generally comprises a differential transistor pair Q1 and Q2, a current source 110 (which is coupled to the emitters of transistors Q1 and Q2), resistors R1 and R2 (which are respectively coupled to a collector of the transistors Q1 and Q2), operational amplifier 106, resistors R3, and current sources 116. The level shifting stage 103 generally comprises transistors Q3 and Q4 and current sources 112 and 114. Output stage generally comprises operational amplifier 108, transistors Q5, Q6, Q7, Q8, and Q9, and resistor R4

In operation, the differential pair Q1 and Q2 receives a driver input voltage VIN1 for controlling a current IOUT through the LED D (which, for example, may be a VCSEL). The input stage 102-1 provides an output signal VIN2 to level shifting stage 103. Typically, the collector of transistor Q1 is coupled to the base of transistor Q3, and the collector of transistor Q2 is coupled to the base of transistor Q4. Current sources 112 and 114 then generally serve to bias transistors Q3 and Q4, respectively, and the collectors of transistors Q3 and Q4 are generally coupled to a supply voltage VSUPP. The level shifter provides a level shifted output signal VIN3 to the output stage 104. Generally, the output signal VIN3 is provided to a first differential pair of transistors Q5 and Q8. The collector of transistor Q8 is coupled LED D (which is also coupled to the supply voltage VSUPP) so as to generally provide that a current through the channel (from collector to emitter) of transistor Q6, which is output current IOUT.

The control loop of the output stage 104 includes a differential pair of transistors Q6 and Q7. These transistors Q6 and Q7 are coupled at their bases to the emitters of transistors Q3 and Q4, which means that the differential pair Q6 and Q7 is switched in accordance with (i.e., similar and synchronously to) the differential pair Q5 and Q6. Additionally, the emitters of the transistors Q5, Q6, Q7 and Q8 are all coupled together. The common emitter node is coupled to negative supply voltage or ground. However, as shown, an inductor L is coupled between the common emitter node and ground, where the high impedance of inductor L serves to stabilize the current ICNTL. Additionally, the collectors of the transistors Q7 and Q8 are coupled together and to supply voltage VSUPP through reference resistor R4.

Additionally, as part of the control loop, the collectors of transistors Q6 and Q7 are coupled to a positive input terminal of operational amplifier 106, while the negative input terminal of operational amplifier 106 is coupled to resistor R3 and to current source 116. The output terminal of operational amplifier 106 is coupled to resistors R1 and R2 so as to provide a common mode voltage VCM, which can be regarded as the supply voltage for the differential pair Q1 and Q2. However, the common mode voltage VCM is controlled through reference signal IREF from the output stage 103, which is the collector current of the second differential pair Q7 and Q8.

Due to the control loop, the current source 116 can be used to determine the maximum magnitude of current IOUT. Increasing the magnitude of current source 116 decreases the voltage level at the negative input terminal of amplifier 106, and since the amplifier 106 attempts to maintain its differential input voltage at 0 (only ideally), signal IREF is generally increased. Therefore, voltage VCM increases, which increases the maximum magnitude of current IOUT (and also signal IREF). If the magnitude of current source 106 is reduced, then the maximum magnitude of current IOUT is reduced.

Another control loop also is implemented for adjusting the voltage level at the collector of transistor Q5. As the differential pair Q5 and Q6 does not have a current source for setting its current, the voltage level at the collector of Q5 should be generally equal to the voltage level on the collector of transistor Q6. Therefore, a voltage follower (which includes amplifier 108 and a MOSFET transistor Q9) is coupled between the collector of transistor Q6 and the collector of transistor Q5. Amplifier OP2 receives (t its positive input terminal) the voltage level at the output node OUT (i.e., the node between the diode D and the collector of transistor Q6). The negative input terminal of operational amplifier 108 is coupled to the collector of transistor Q5 and the source of transistor Q9. Operational amplifier 108 supplies a control voltage to the gate of transistor Q9, which provides that the positive and negative input terminals of amplifier 106 have basically the same voltage level. This means that the collector of transistor Q5 has basically the same voltage level as the collector of transistor Q6.

Additionally, the external inductor L is used to substitute the transistor based current source for reducing the headroom voltage needed to generate the output stage tail current ICNTL. The advantage of using an inductor rather than a resistor as a substitute for the transistor based current source is the high impedance of the inductor LFB at high frequencies. This leads to a generally constant current ICNTL with respect to high-frequency ripple, which can be present at the common emitter node of transistors Q5 and Q6. This improves the jitter performance of the output driver as current ICNTL has a reduced ripple.

Since the series resistance of commercially available inductors (e.g., ferrite beads) can be well below 2Ω, the voltage at the common emitter node of transistors Q5 and Q6 does not exceed 60 mV (2Ω*30 mA=60 mV) for tail currents ICNTL up to 30 mA. Therefore the base voltage of Q5, Q6, Q7, and Q8 is less than 900 mV. Assuming a minimum supply voltage VSUP of 2.9V and a maximum voltage drop across diode D (or VDROP) of 2.1V, the base-collector voltage of transistor Q6 ($V_{Bc6}$) is:

$$V_{BC6}=V_{B6}-(V\text{SUP}-V\text{DROP})=0.9V-(2.9V-2.1V)\\=0.1V. \quad (1)$$

Therefore, the transistor Q6 is operated outside its saturation mode ($V_{BC6}$<0.3V) and improved performance can be provided in terms of output current edge speed and jitter.

In this embodiment, the base voltages $V_{B5}$ and $V_{B6}$ of the differential pair Q5 and Q6 (which is generally equal to the voltage VIN3) may advantageously be controlled such that the desired tail current ICNTL is generated. This can be performed by sensing the current IREF with transistors Q7 and Q8. The current IREF is advantageously a fraction of the tail current ICNTL. The ratio of reference current to tail current ICNTL can be set to 1/(n+1). The factor n is defined by the relative size of the transistors Q5 and Q6 with respect to transistors Q7 and Q8; typically, transistors Q5 and Q6 are n-times the size of transistors Q7 and Q8. The sensed current IREF generates a voltage drop at resistor R4 which is fed to the non-inverted input terminal of the amplifier 106. The inverted input terminal of amplifier 106 is controlled by a voltage drop across resistor R3 generated by a current from current source 116. The operational amplifier 106 controls the voltage VCM, which in turn determines the voltages $V_{B5}$ and $V_{B6}$. Consequently, the voltage VIN3 is controlled with the current source 116 such that current IREF is generally equal to current ISET of current source 116, if the resistance values of resistors R3 and R4 are generally equal. This means that the maximum magnitude of the output driver tail current ICNTL can be controlled by adjusting current source 116 (or current ISET). The maximum output current IOOUTMAX may then be generally defined as:

$$IOUTMAX=n/(1+n)*ICNTL=n*ISET. \quad (2)$$

The average current IOUTAVG of the output is then generally defined as:

$$IOUTAVG=n/(1+n)*ICNTL/2=n*ISET/2 \quad (3)$$

In addition, the operational amplifier 108 is used to control the collector of transistor Q5 to be at the same bias voltage as the collector of Q6, in order to keep the transistors of the output driver differential pair in a balanced operating mode.

Figure 2:
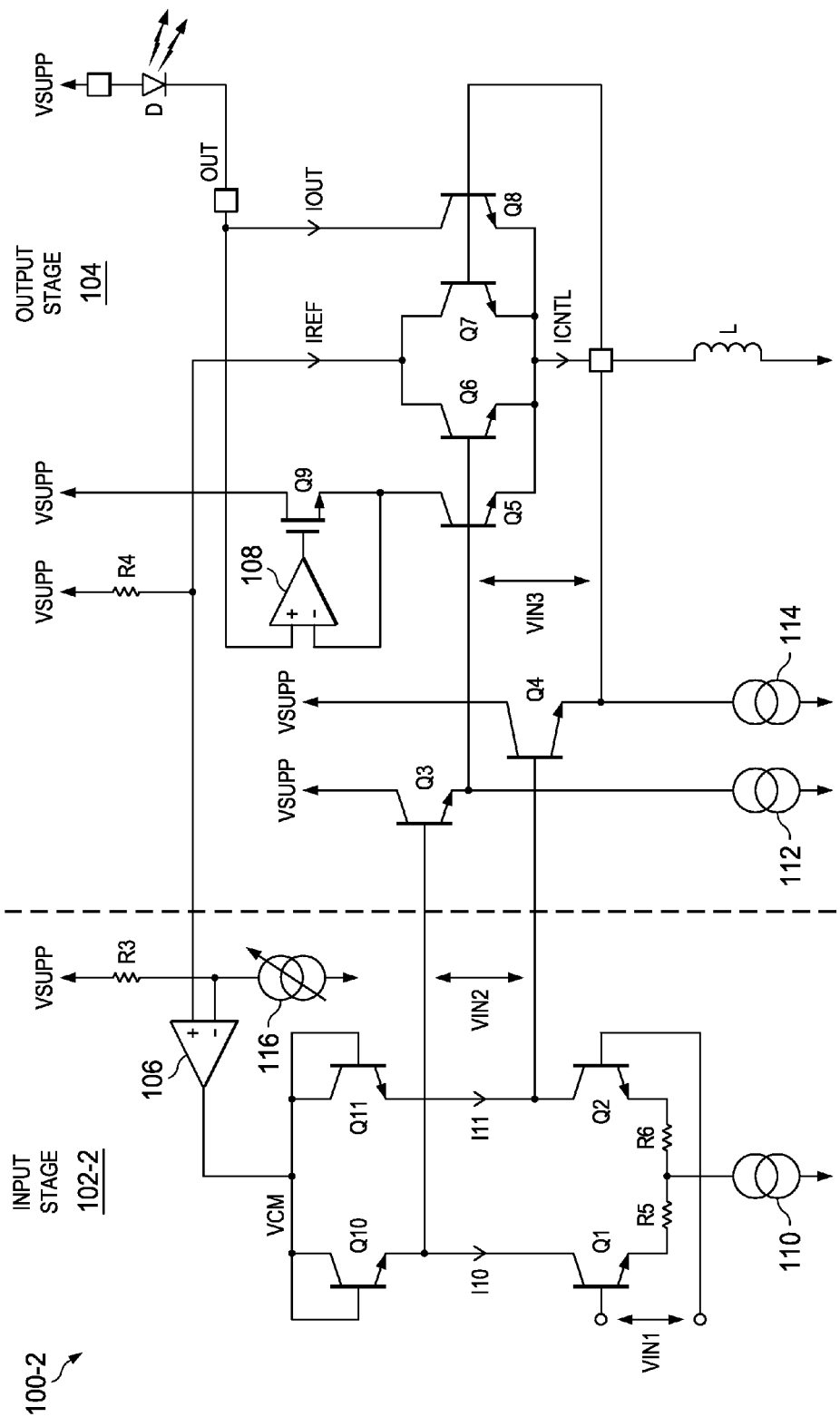

Turning to FIG. 2, IC 100-2 can be seen. IC 100-2 is similar to IC 100-1; however, a difference can be found in 102-2. As shown, diode-connected transistors Q10 and Q11 are coupled to the collectors of transistors Q1 and Q2 (respectively), and resistors R5 and R6 are coupled between the emitters of transistors Q1 and Q2 (respectively) and current source 110. This configuration can be used to control the extinction ratio ER, which should be kept generally constant during operation and which is generally defined as:

$$ER=IONE/IZERO \quad (4)$$

where IONE is the current of the logic '1' level (logic high) and IZERO is the current of the logic '0' level (logic low). The extinction ration is generally infinite, if the output stage 103 is capable of completely switching off. Under these circumstances current IONE is generally equal to current IOUTMAX, and current IZERO is generally equal to 0. The configuration of IC 100-2 generally allows the desired extinction ratio to be set and to be controlled by input voltage VIN1.

Here, the resistors R1 and R2 of IC 100-1 are replaced with transistors Q10 and Q11 so as provide diode loads. Furthermore, additional degeneration resistors R5 and R6 are added to the differential pair Q1 and Q2. The input voltage VIN1 is linearly converted into the currents I10 and I11 through the transistors Q9 and Q10 which results in a pre-distorted voltage VIN2 that is fed to the emitter followers Q3 and Q4. Emitter followers Q3 and Q4 serve to generate a bias level shift needed for the output driver. They also provide a low impedance driving stage for voltage VIN3. Voltage VIN3 has a generally identical, pre-distorted signal shape as voltage VIN2. Due to the pre-distorted nature of VIN3, current IOUT of differential pair Q5 and Q6 is a linear function of the currents I10 and I11. Therefore, current IOUT is also linear function of pre-driver's input voltage VIN1. Therefore, the pre-driver circuit comprising transistors Q1, Q2, Q9, Q10, Q3, and Q4 in combination with the output differential pair Q5 and Q6 acts as a translinear stage.

While the output current mean value IOUTAVG is still controlled by the output driver tail current ICNTL (and therefore set by ISET), the maximum and minimum output current value is determined by the swing of IOUT, and therefore controlled by the swing of VIN1. Keeping the input swing of voltage VIN1 constant results in a constant extinction ration independent from the mean value IOUTAVG of the output current IOUT, which is set by current ISET.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a first supply rail;
   a second supply rail;
   an driver output terminal;
   a first differential pair that receives an input signal;
   a level shifter that is coupled to the first differential pair;
   a second differential pair that is coupled to the level shifter and a common node;
   a voltage follower that is coupled across the second differential pair and that is coupled to the driver output terminal;
   a third differential pair that is coupled to the common node;
   a first resistor that is coupled between the first supply rail and each transistor of the third differential pair;
   a second resistor that is coupled to the first supply rail;
   an amplifier having an first input terminal, a second input terminal, and an output terminal, wherein the first input terminal is coupled to the first resistor, and wherein the second input terminal is coupled to the second resistor, and wherein the output terminal is coupled to each transistor of the first differential pair; and
   a current source that is coupled between the second input terminal and the second supply rail.

2. The apparatus of claim 1, wherein the second differential pair further comprises:
   a first bipolar transistor that is coupled to the level shifter at its base, that is coupled to the voltage follower at its collector, and that is coupled to the common node at its emitter; and
   a second bipolar transistor that is coupled to the level shifter at its base, that is coupled to the driver output terminal and voltage follower at its collector, and that is coupled to the common node at its emitter.

3. The apparatus of claim 2, wherein the third differential pair further comprises:
   a fourth bipolar transistor that is coupled to the base of the first bipolar transistor at its base, that is coupled to the common node at its emitter, and that is coupled to the first resistor at is collector; and
   a fifth bipolar transistor that is coupled to the base of the second bipolar transistor at its base, that is coupled to the common node at its emitter, and that is coupled to the first resistor at its collector.

4. The apparatus of claim 3, wherein the amplifier further comprises a first amplifier, and wherein the voltage follower further comprises:
   a second amplifier having an first input terminal, a second input terminal, and an output terminal, wherein the first input terminal of the second amplifier is coupled to the driver output terminal, and wherein the second input terminal of the second amplifier is coupled to the collector of the first bipolar transistor; and
   a MOS transistor that is coupled to the first voltage rail at its drain, that is coupled to the output terminal of the second amplifier at its gate, and that is coupled to the collector of the first bipolar transistor at is source.

5. The apparatus of claim 4, wherein the first differential pair further comprises:
   a sixth bipolar transistor that receives a first portion of the input signal at its base and that is coupled to the output terminal of the first amplifier at its collector; and
   a seventh bipolar transistor that receives a second portion of the input signal at its base, that is coupled to the output terminal of the first amplifier at its collector, and that is coupled to the emitter of the sixth bipolar transistor at its emitter.

6. The apparatus of claim 5, wherein the apparatus further comprises:
   a third resistor that is coupled between the output terminal of the first amplifier and the collector of the sixth bipolar transistor; and
   a fourth resistor that is coupled between the output terminal of the first amplifier and the collector of the seventh bipolar transistor.

7. The apparatus of claim 5, wherein the apparatus further comprises:
   a first diode-connected transistor that is coupled between the output terminal of the first amplifier and the collector of the sixth bipolar transistor; and
   a second diode-connected transistor that is coupled between the output terminal of the first amplifier and the collector of the seventh bipolar transistor.

8. The apparatus of claim 7, wherein the apparatus further comprises a plurality of resistor coupled in series with one another between the emitters of the sixth and seventh bipolar transistors.

9. An apparatus comprising:
   a first supply rail;
   a second supply rail;
   an driver output terminal;
   a light emitting diode (LED) that is coupled between the first supply rail and the driver output terminal;
   a first differential pair that receives an input signal;
   a level shifter that is coupled to the first differential pair;
   a second differential pair that is coupled to the level shifter and a common node;
   a voltage follower that is coupled across the second differential pair and that is coupled to the driver output terminal;
   a third differential pair that is coupled to the common node;
   a first resistor that is coupled between the first supply rail and each transistor of the third differential pair;
   a second resistor that is coupled to the first supply rail;
   an amplifier having an first input terminal, a second input terminal, and an output terminal, wherein the first input terminal is coupled to the first resistor, and wherein the second input terminal is coupled to the second resistor, and wherein the output terminal is coupled to each transistor of the first differential pair; and
   a current source that is coupled between the second input terminal and the second supply rail.

10. The apparatus of claim 9, wherein the second differential pair further comprises:
    a first bipolar transistor that is coupled to the level shifter at its base, that is coupled to the voltage follower at its collector, and that is coupled to the common node at its emitter; and
    a second bipolar transistor that is coupled to the level shifter at its base, that is coupled to the driver output terminal and voltage follower at its collector, and that is coupled to the common node at its emitter.

11. The apparatus of claim 10, wherein the third differential pair further comprises:
    a fourth bipolar transistor that is coupled to the base of the first bipolar transistor at its base, that is coupled to the common node at its emitter, and that is coupled to the first resistor at is collector; and a fifth bipolar transistor that is coupled to the base of the second bipolar transistor at its base, that is coupled to the common node at its emitter, and that is coupled to the first resistor at its collector.

12. The apparatus of claim 11, wherein the amplifier further comprises a first amplifier, and wherein the voltage follower further comprises:
   a second amplifier having an first input terminal, a second input terminal, and an output terminal, wherein the first input terminal of the second amplifier is coupled to the driver output terminal, and wherein the second input terminal of the second amplifier is coupled to the collector of the first bipolar transistor; and
   a MOS transistor that is coupled to the first voltage rail at its drain, that is coupled to the output terminal of the second amplifier at its gate, and that is coupled to the collector of the first bipolar transistor at is source.

13. The apparatus of claim 12, wherein the first differential pair further comprises:
   a sixth bipolar transistor that receives a first portion of the input signal at its base and that is coupled to the output terminal of the first amplifier at its collector; and
   a seventh bipolar transistor that receives a second portion of the input signal at its base, that is coupled to the output terminal of the first amplifier at its collector, and that is coupled to the emitter of the sixth bipolar transistor at its emitter.

14. The apparatus of claim 13, wherein the apparatus further comprises:
   a third resistor that is coupled between the output terminal of the first amplifier and the collector of the sixth bipolar transistor; and
   a fourth resistor that is coupled between the output terminal of the first amplifier and the collector of the seventh bipolar transistor.

15. The apparatus of claim 13, wherein the apparatus further comprises:
   a first diode-connected transistor that is coupled between the output terminal of the first amplifier and the collector of the sixth bipolar transistor; and
   a second diode-connected transistor that is coupled between the output terminal of the first amplifier and the collector of the seventh bipolar transistor.

16. The apparatus of claim 15, wherein the apparatus further comprises a plurality of resistor coupled in series with one another between the emitters of the sixth and seventh bipolar transistors.

* * * * *